US011709775B2

(12) United States Patent
Sheperek et al.

(10) Patent No.: US 11,709,775 B2
(45) Date of Patent: *Jul. 25, 2023

(54) WRITE DATA FOR BIN RESYNCHRONIZATION AFTER POWER LOSS

(71) Applicant: Micron Technology, Inc., Boise, ID (US)

(72) Inventors: Michael Sheperek, Longmont, CO (US); Bruce A. Liikanen, Berthoud, CO (US); Steven Michael Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/694,434

(22) Filed: Mar. 14, 2022

(65) Prior Publication Data

US 2022/0197795 A1  Jun. 23, 2022

Related U.S. Application Data

(63) Continuation of application No. 16/948,774, filed on Sep. 30, 2020, now Pat. No. 11,301,382.

(Continued)

(51) Int. Cl.
| | |
|---|---|
| *G06F 12/0804* | (2016.01) |
| *G06F 3/06* | (2006.01) |
| *G11C 16/30* | (2006.01) |
| *G11C 16/32* | (2006.01) |
| *G01R 19/165* | (2006.01) |

(Continued)

(52) U.S. Cl.
CPC ... *G06F 12/0804* (2013.01); *G01R 19/16538* (2013.01); *G06F 3/064* (2013.01); *G06F 3/0619* (2013.01); *G06F 3/0659* (2013.01); *G06F 3/0679* (2013.01); *G11C 16/10* (2013.01);
(Continued)

(58) Field of Classification Search
CPC ........ G01R 19/16538; G01R 19/16552; G06F 1/30; G06F 1/305; G06F 3/0619; G06F 3/064; G06F 3/0659; G06F 3/0679; G06F 11/1441; G06F 12/0804; G06F 2201/81; G06F 2212/1032; G11C 5/143; G11C 16/0483; G11C 16/10; G11C 16/22; G11C 16/30; G11C 16/32; G11C 16/3418
See application file for complete search history.

(56) References Cited

U.S. PATENT DOCUMENTS

| | | |
|---|---|---|
| 9,251,909 B1 | 2/2016 | Camp et al. |
| 2007/0028122 A1 | 2/2007 | Chuang |

(Continued)

*Primary Examiner* — Larry T Mackall
(74) *Attorney, Agent, or Firm* — Lowenstein Sandler LLP

(57) ABSTRACT

A system includes a memory device and a processing device, operatively coupled to the memory device, the processing device to perform operations comprising: measuring one of a temperature voltage shift or a read bit error rate of fixed data stored in the memory device in response to detecting a power on of the memory device, the fixed data having been programmed in response to detecting a power loss; estimating an amount of time for which the memory device was powered off based on results of the measuring; and in response to the amount of time satisfying a threshold criterion, updating a value for a temporal voltage shift of a block family based on the amount of time.

20 Claims, 10 Drawing Sheets

Related U.S. Application Data

(60) Provisional application No. 62/706,388, filed on Aug. 13, 2020.

(51) Int. Cl.
*G11C 16/10* (2006.01)
*G11C 16/04* (2006.01)

(52) U.S. Cl.
CPC .............. *G11C 16/30* (2013.01); *G11C 16/32* (2013.01); *G06F 2212/1032* (2013.01); *G11C 16/0483* (2013.01)

(56) References Cited

U.S. PATENT DOCUMENTS

| | | |
|---|---|---|
| 2010/0053796 A1 | 3/2010 | Boyle et al. |
| 2014/0281315 A1 | 9/2014 | Danilak et al. |
| 2014/0310445 A1 | 10/2014 | Fitzpatrick et al. |
| 2017/0052859 A1 | 2/2017 | Scouller et al. |
| 2018/0089076 A1 | 3/2018 | Li et al. |
| 2020/0218649 A1 | 7/2020 | Dinges et al. |
| 2021/0182166 A1* | 6/2021 | Hahn .................. G06F 11/3034 |

* cited by examiner

Read a time value of a low power clock. 650

↓

Measure a temporal voltage shift of the data that was written to the memory device. 655

↓

Determine, based on the time value and the temporal voltage shift, an estimated amount of time the memory device was powered off. 660

Estimated amount of time satisfy a second threshold criterion (greater than the first threshold criterion)? 670

No → (loops back)

Yes ↓

Tune an algorithm, which is used to measure temporal voltage shift of block families, in order to accurately measure aged programmed pages based on the estimated amount of time. 675

FIG. 6C

WRITE DATA FOR BIN RESYNCHRONIZATION AFTER POWER LOSS

REFERENCE TO RELATED APPLICATION

This application is a continuation of U.S. patent application Ser. No. 16/948,774, filed Sep. 30, 2020, which claims the benefit of U.S. Provisional Patent Application No. 62/706,388, filed Aug. 13, 2020, each of which is incorporated herein by this reference.

TECHNICAL FIELD

Embodiments of the disclosure are generally related to memory sub-systems, and more specifically, are related to write data for bin resynchronization after power loss.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 6B is a flow diagram of an example extension method of the method of FIG. 6A when considering a time value of a low power clock after power on in accordance with various embodiments.

FIG. 6C is a flow diagram of an example method for tuning a temporal voltage shift measurement algorithm to measure temporal voltage shift of aged block families after power on, in accordance with some embodiments.

DETAILED DESCRIPTION

Figure 1:
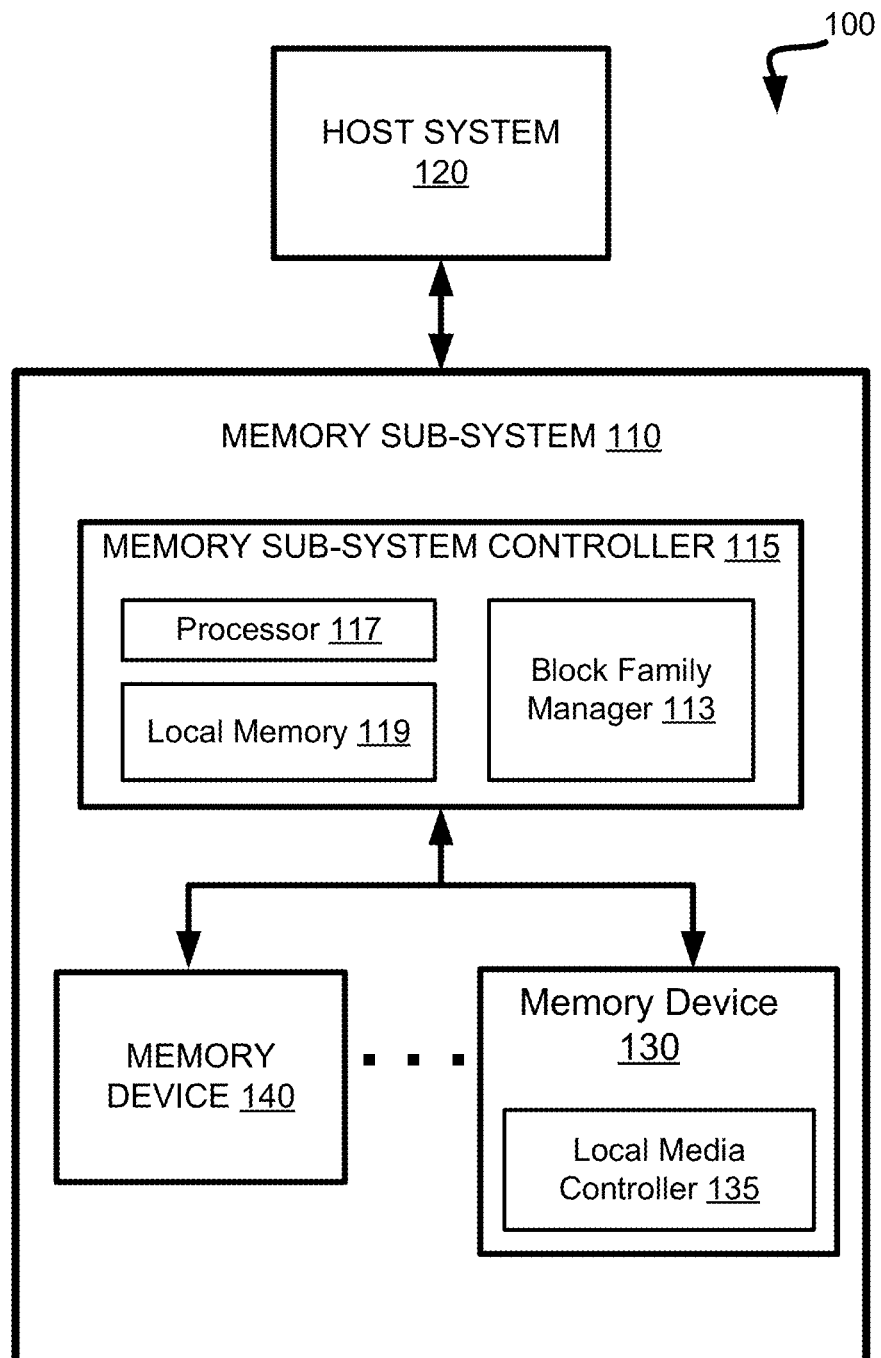
FIG. 1 illustrates an example computing system that includes a memory sub-system in accordance with some embodiments.

Embodiments of the present disclosure are directed to write data for bin resynchronization after power loss. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. A "block" includes a set of contiguous or non-contiguous memory pages. An example of a block is an erasable block, which is a minimal erasable unit of memory, while a page is a minimal writable unit of memory. Each page includes a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, hereinafter is referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g., used to distinguish age of data written), valid bitmap (which LBAs or logical transfer units contain valid data), block family information, and the like.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (TVS), since the degrading electric charge causes the voltage distributions to shift along the voltage axis towards lower voltage levels. The threshold voltage changes rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations (or RBER). Various common implementations either fail to adequately address the temporal voltage shift or employ inefficient strategies resulting in high RBER and/or exhibiting other shortcomings.

Embodiments of the present disclosure address the above-noted and other deficiencies by implementing a memory sub-system that employs block family based error avoidance strategies, thus significantly improving the bit error rate exhibited by the memory sub-system. The TVS can be selectively tracked for a programmed set of memory cells grouped by block families, and appropriate voltage offsets, which are based on block affiliation with a certain block family, are applied to the base read levels in order to perform read operations. "Block family" herein shall refer to a possibly non-contiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family can be made with any granularity, containing only whole codewords, whole pages, whole super pages, or whole superblocks, or any combination of these. "Data state metric" herein shall refer to a quantity that is measured or inferred from the state of data stored on a memory device. Specifically, the data state metrics can reflect the state of the temporal voltage shift, the degree of read disturb, and/or other measurable functions of the data state. A composite data state metric is a function (e.g., a weighted sum) of a set of component state metrics.

In these embodiments, the time window of a block family can vary depending on temperature (or other parameters) associated with the block family, over time, while the block family is opened. Upon meeting certain criteria, such as passage of a particular amount of time at a certain aggregate temperature, the block family is closed. Since the time elapsed after programming and temperature are the main factors affecting the TVS, all pages, blocks, and/or partitions within a single block family are presumed to exhibit similar distributions of threshold voltages in memory cells, and thus would require the same voltage offset values (or trims) to be applied to the base read levels for read operations. "Base read level" herein shall refer to the initial threshold voltage level exhibited by the memory cell immediately after programming. In some implementations, base read levels can be stored in the metadata of the memory device.

A memory sub-system controller periodically performs a calibration process in order to associate each die of each block family with one of the predefined threshold voltage offset bins, which is in turn associated with the voltage offset to be applied for read operations. The association of pages or blocks with block families and block families and dies with threshold voltage offset bins can be stored in respective metadata tables maintained by the memory sub-system controller.

The TVS for a block family continues to shift even after the memory sub-system, and thus the memory device thereof, is powered off. The loss of power can be expected, as in a user that purposefully powers down a computing system, or unexpected, as in due to a failure of a power supply or other source of power. As the amount of time the memory sub-system is powered off is unpredictable and cannot always be precisely tracked (due to the loss of power), the memory sub-system controller can, after powering back on, apply the wrong threshold voltage offset as a trim value when performing a read operation. The longer the memory device is powered off, the greater chance for higher levels of RBER when attempting to read data from the block family. This can lead to loss of data in a worst case scenario. In some situations, the longer the memory device is powered off, the more time required to perform scanning measurements of block family data and resynchronization that is undertaken to put the memory device into full operation, e.g., in being able to execute host memory commands of a host system. This time between power on of the memory sub-system and when the memory sub-system can satisfy all performance requirements is referred to as time to performance (TTP).

To avoid these deficiencies and to effectively track (and reduce) TTP, the memory sub-system controller can, according to various embodiments, take steps before power off and after power on of the memory sub-system to estimate the amount of time the memory device was powered off. This amount of time can then be used in order to update the temporal voltage shift for the block family, assuming the amount of time satisfies (e.g., is at least as great as) a first threshold criterion. Additionally, the memory sub-system controller can resynchronize one or more of the block families, based on their updated TVS values, to point to threshold voltage offset bins that are associated with discrete threshold voltage offset values (e.g., depending on type of memory, read level, and die) corresponding to these updated TVS values. However, if the amount of time the memory sub-system was powered off is sufficiently short (e.g., less than the first threshold criterion), the controller can transition directly to execution of host memory commands, thus minimizing TTP when no scanning or TVS adjustments are necessary.

In one embodiment, in response to detecting an imminent power loss, the controller can write data to the memory device (e.g., that is a non-volatile memory (NVM) device) before the memory sub-system completing shuts down. The controller can determine the power loss is "imminent" by detecting a voltage of a power source dropping below a threshold voltage, e.g., from which is not recoverable and will lead to powering off of the memory sub-system. The data that is written can be fixed data, such as data with a predetermined pattern that can be recognized by the controller despite incurring numerous read errors when attempting to read the data. When the memory sub-system powers back on, the controller can measure a characteristic of the data such as temporal voltage shift or a read bit error rate of the data. The controller can determine an estimated amount of time for which the memory device was powered off based on results of this measurement, e.g., values of the measured characteristic. This estimated amount of time may be further revised based on a value of a lower power clock that continued to operate during power off of the memory device using a lower power source.

Upon receiving a read command, the memory sub-system controller can identify the block family associated with the page or block identified by the logical block address (LBA) specified by the read command, identify the threshold voltage offset bin associated with the block family and die on which the page or block resides, compute the new threshold voltage by additively applying the threshold voltage offset associated with the threshold voltage offset bin to the base read level, and perform the read operation using the new threshold voltage.

Therefore, advantages of the systems and methods implemented in accordance with some embodiments of the present disclosure include, but are not limited to, improving the bit error rate in read operations by maintaining metadata tracking groups of memory cells (as block families) that are presumed to exhibit similar voltage distributions and selectively performing calibration operations for limited subsets of memory cells based on their block family association. Further, because such tracking, storage, and calibration are performed on a block family basis as opposed to a per-block (or per-page) basis, processing, memory, and storage resources are preserved for host system usage. Other advantages will be apparent to those skilled in the art of memory allocation and error optimization within a memory sub-system discussed hereinafter.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs), can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D crosspoint array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "super-block."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family manager 113 that can be used to implement the block family-based error avoidance strategies in accordance with embodiments of the present disclosure. In some embodiments, the controller 115 includes at least a portion of the block family manager 113. For example, the controller 115 can include a processor 117 (processing device) configured to execute instructions stored in local memory 119 for performing the operations described herein. In some embodiments, the block family manager 113 is part of the host system 120, an application, or an operating system. The block family manager 113 can manage block families associated with the memory devices 130, as described in more detail herein below.

Figure 2:
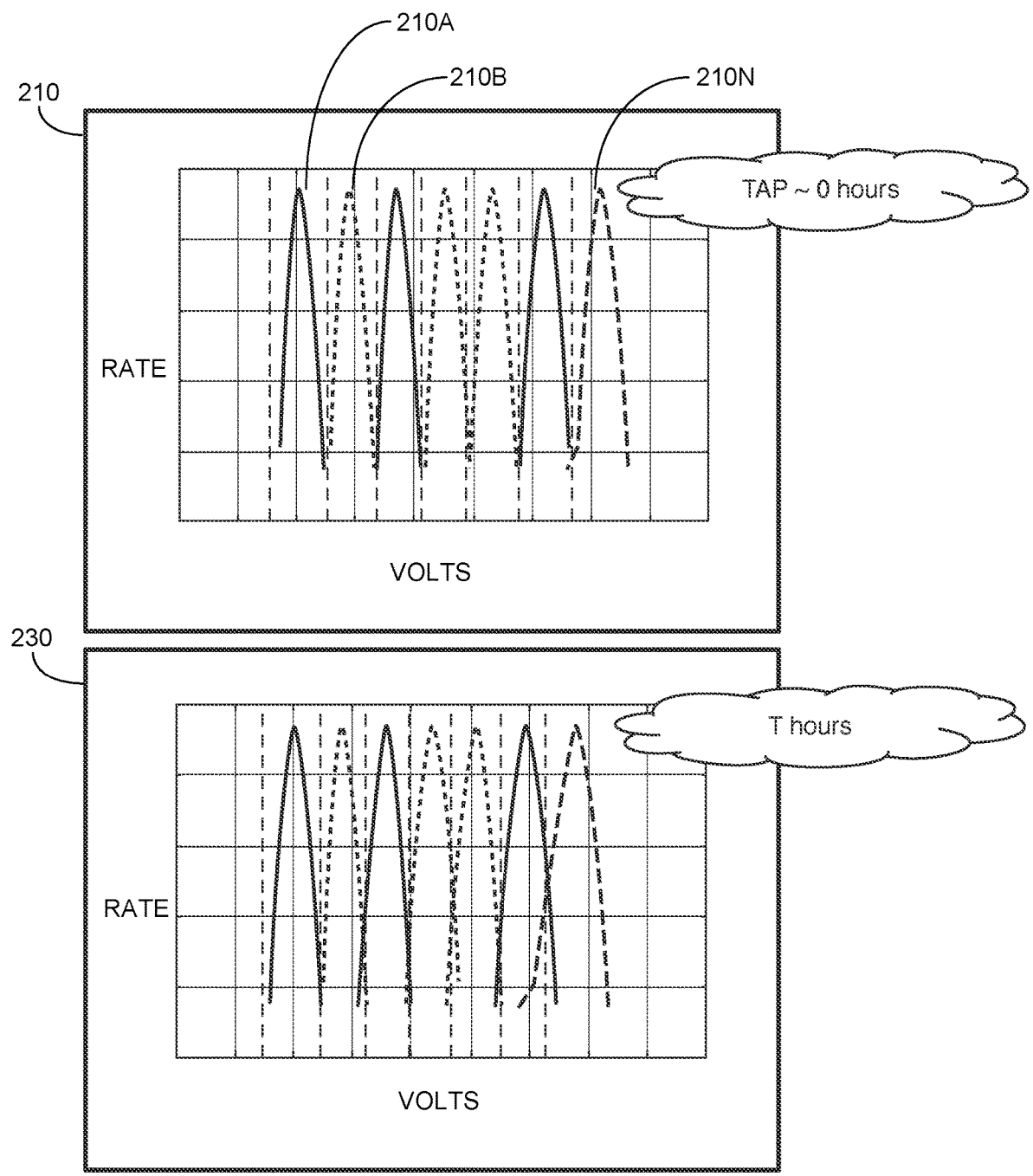
FIG. 2 is a set of graphs that illustrate a temporal voltage shift caused by the slow charge loss exhibited by triple-level memory cells, in accordance with some embodiments.

FIG. 2 is a set of graphs that illustrate a temporal voltage shift caused by the slow charge loss exhibited by triple-level memory cells, in accordance with some embodiments. While the illustrative example of FIG. 2 utilizes triple-level cells, the same observations can be made and, accordingly, the same remedial measures are applicable to single level cells and multi-level cells in order to compensate for the slow charge loss.

As noted herein above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows establishing multiple threshold voltage levels corresponding to different logical levels, thus effectively allowing a single memory cell to store multiple bits of information: a memory cell operated with $2^n$ different threshold voltage levels is capable of storing n bits of information.

In FIG. 2, each graph illustrates a voltage distribution 210A, 210B, . . . 210N produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the threshold voltage levels (shown by dashed vertical lines) are defined, such that any measured voltage that falls below a threshold level is associated with one distribution of the pair of neighboring distributions, while any measured voltage that is greater than or equal to the threshold voltage level is associated with another distribution of the pair of neighboring distributions.

The set of a graphs include a first graph 210 that reflects a time period immediately after programming and a second graph 230 that reflects a long time after programming. As seen by comparing the second graph 230 to the first graph 210, the voltage distributions 210A, 210B, . . . 210N change in time due to the slow charge loss, which results in drifting values of the threshold voltage levels (shown by dashed vertical lines). In various embodiments, this temporal voltage shift (TVS) is selectively tracked for programmed pages grouped by block families, and appropriate voltage offsets, which are based on page affiliation with a certain block family, are applied to the base read levels in order to perform read operations.

Figure 3:
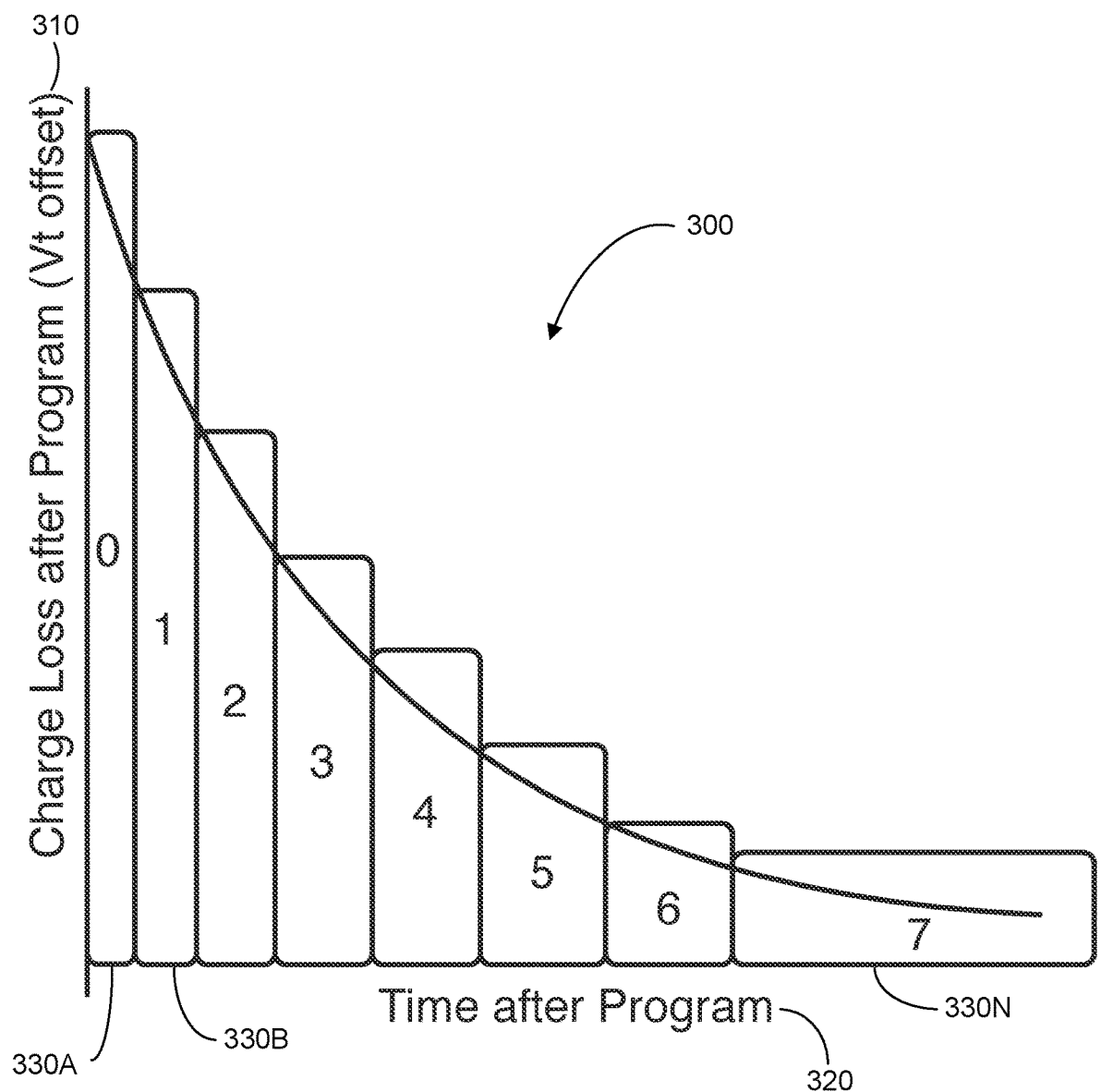
FIG. 3 is an example graph illustrating the dependency of a threshold voltage offset on the time after program, e.g., the period of time elapsed since a page had been programmed, in accordance with some embodiments.

FIG. 3 is an example graph 300 illustrating the dependency of a threshold voltage offset 310 on the time after program 320, e.g., the period of time elapsed since a page had been programmed, in accordance with some embodiments. As schematically illustrated by FIG. 3, page or blocks (or groups of memory cells at another granularity) of the memory device are grouped into block families 330A-330N, such that each block family includes one or more pages or blocks that have been programmed within a specified time window (or window of time), potentially varied by aggregate temperature and/or PEC while the block family is open. As noted herein above, since the time elapsed after programming and temperature are the main factors affecting the temporal voltage shift, all pages, blocks, and/or partitions within a single block family are presumed to exhibit similar distributions of threshold voltages in memory cells, and thus would require the same voltage offsets for read operations as time passes.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family, which time period can vary significantly depending on an aggregate temperature and/or PEC associated with pages during programming. More specifically, the entire asymptotic curve illustrated in FIG. 3 can be shifted to have a steeper curve with respect to time as aggregate temperature and/or PEC increases. Slow charge loss is illustrated along the vertical access for the seventh valley (V7) based on digital-to-analog (DAC) converted voltage values, also referred to as DACs. Each DAC can represent a certain number of millivolts (mV), here about 10 mV by way of example.

A newly created block family can be associated with bin 0, and each subsequently created block family can be associated with a sequentially numbered block family. Then, the memory sub-system controller can periodically perform a calibration process in order to associate each die of every block family with one of the predefined threshold voltage offset bins (e.g., bins 0-7 in the illustrative example of FIG. 3), which is in turn associated with the voltage offset to be applied for read operations. The associations of pages, blocks, and/or partitions with block families and block families and dies with threshold voltage offset bins can be stored in respective metadata tables maintained by the memory sub-system controller 115.

Figure 4A:
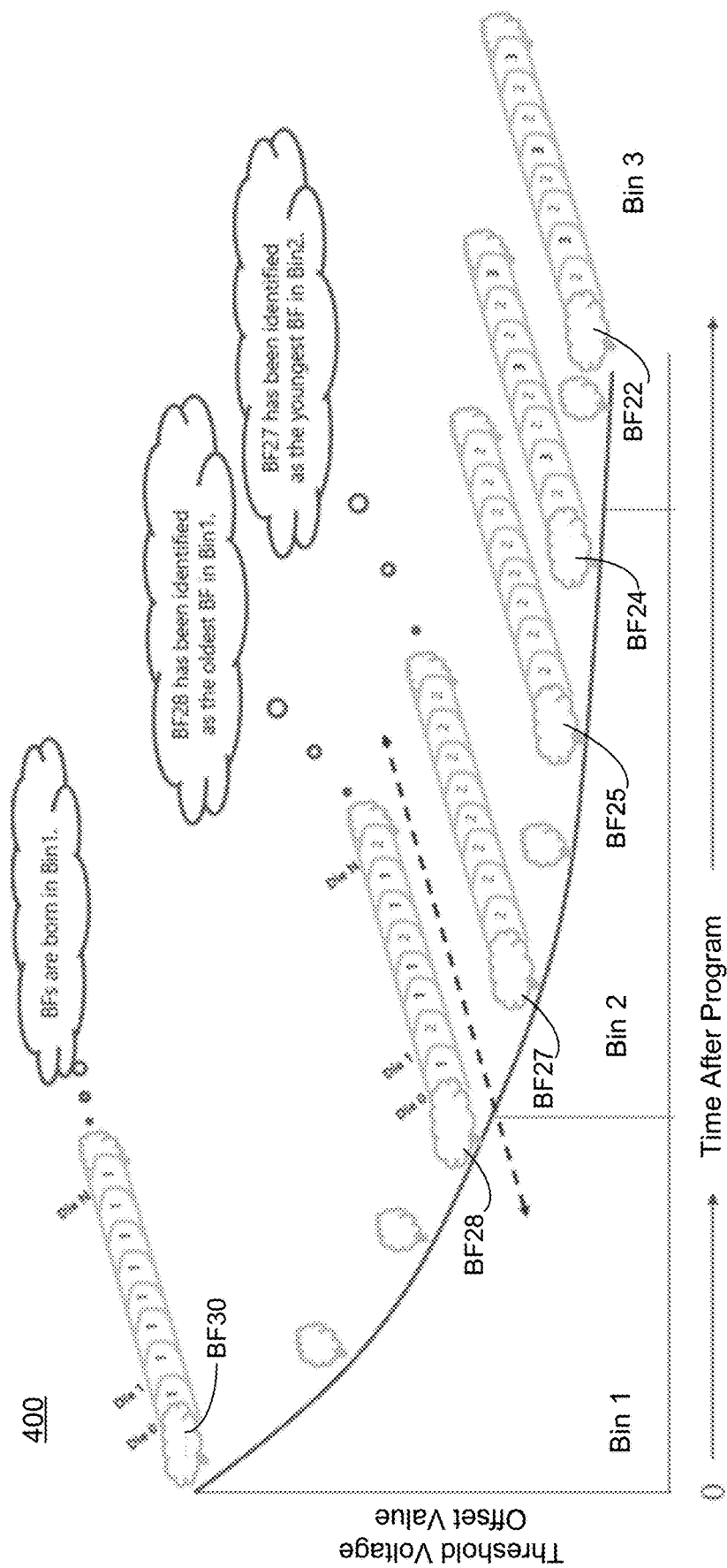
FIG. 4A is a graph illustrating how block families exist in a particular threshold voltage offset bin, which depends on time after program (TAP) in accordance to an embodiment.
Figure 4B:
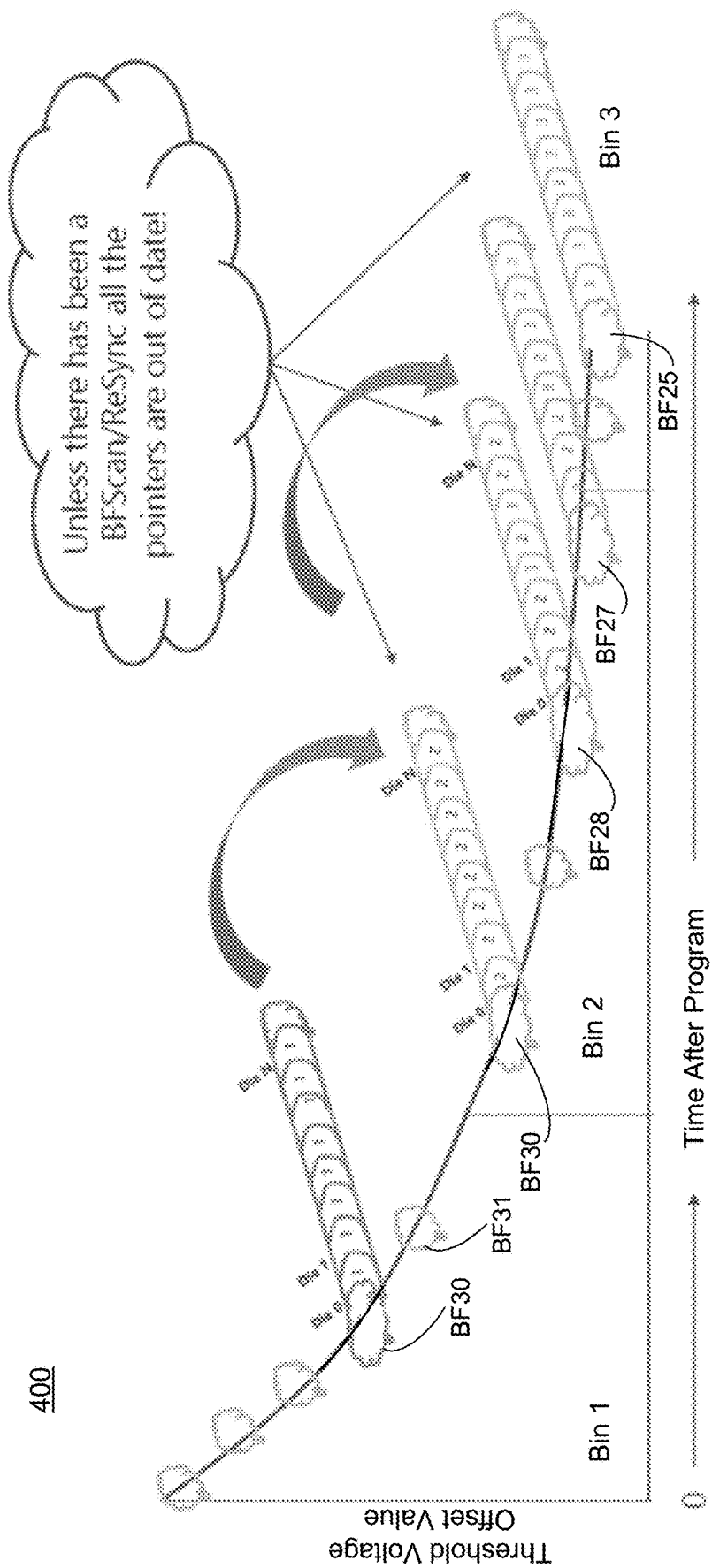
FIG. 4B is the graph illustrating how block families move to the right with increasing time after program (TAP) in accordance with an embodiment.

FIG. 4A is a graph 400 illustrating how block families exist in a particular threshold voltage offset bin, which depends on time after program (TAP) in accordance to an embodiment. FIG. 4B is the graph 400 illustrating how block families move to the right with increasing time after program (TAP) in accordance with an embodiment. In the example embodiment of FIG. 4A, block families (BFs) are born in the first threshold voltage offset bin (Bin 1 for short), and age over time to transition to being associated (or re-identified) with a subsequent threshold voltage offset bin. The drift in TVS (which is along the Y axis in the graph 400) starts more quickly with respect to TAP and thus has a steeper curve at first and slows down later, leveling out this curve.

As illustrated in FIG. 4A, BF28 is identified as the oldest block family in Bin 1 because at least a part of the data in BF28 is still within the time after program (TAP) defined by Bin 1. Further, BF30 has just been created (e.g., closed as a BF) and is the youngest block family in Bin 1. Similarly, BF27 is identified as the youngest block family in the second threshold voltage offset bin (Bin 2) and BF24 as the oldest block family in Bin 2. Further, BF22 is old enough to reside now in the third threshold voltage offset bin (Bin 3). While many threshold voltage offset bins can exist, the embodiment of FIG. 4A illustrates three bins solely for purposes of explanation, each of which is associated with one or more threshold voltage offset values.

As is evidenced in FIG. 4B, the block families generally drift in threshold voltage offset over time, where BF28 and BF30 are both now in Bin 2, BF25 is in Bin 3, and new block families BF31 and younger BFs are located in Bin 1. Due to the fact that block families are drifting over time with respect to the threshold voltage offset value, the block family manager 113 can perform a scan of the memory cells of the memory device (e.g., to measure TVS levels) and a resynchronization of pointers of the block families based on the measured TVS levels. The scanning can be limited to the block families that exist at the boundaries between threshold voltage offset bins (e.g., BF24 and BF28 as viewed in FIG. 4A) and are thus anticipated to be the first to move into a new bin. Depending on frequency of scanning, one or more BFs that have recently transitioned into new bins can also be measured and their bin pointers resynchronized. Resynchronization of pointers refers to updating pointers between metadata tables that tell the controller 115 which threshold voltage offset bin to use for which block families and thus, ultimately, which threshold voltage offset values to apply for which block families (see FIG. 7).

Figure 5:
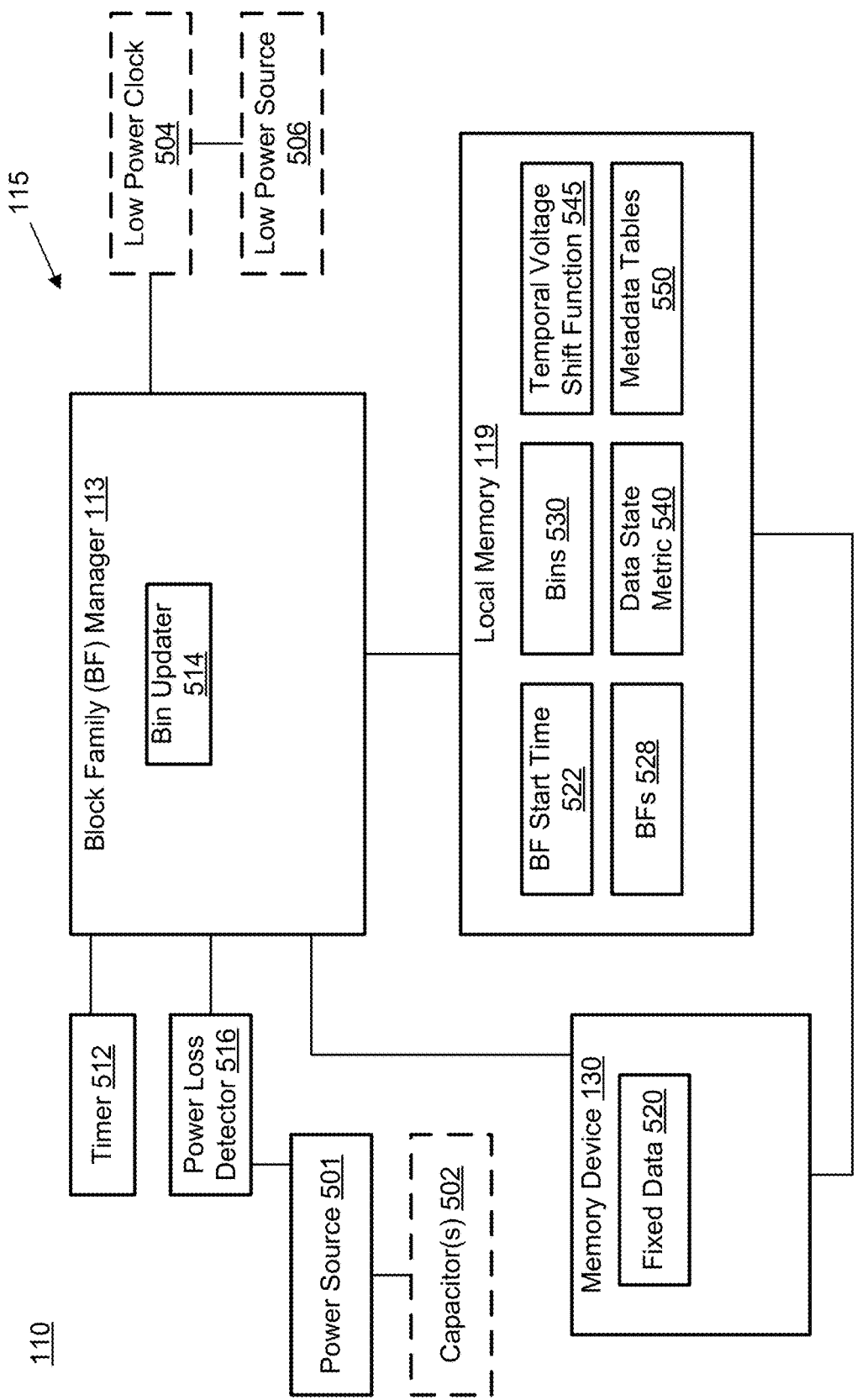
FIG. 5 is a block diagram that illustrates operation of a block family manager within the memory sub-system controller of FIG. 1 in accordance with various embodiments.

FIG. 5 is a block diagram that illustrates operation of the block family manager 113 within the memory sub-system controller 115 of FIG. 1 in accordance with some embodiments. In various embodiments, the memory sub-system 110 further includes a power source 501 (e.g., power supply), optionally one or more capacitors 502 coupled to the power source 501, a timer 512, a power loss detector 516, and optionally a low power clock 504 coupled to a low power source 506. The power loss detector 516 is coupled to the power source 501. In various embodiments, the timer 512 and the power loss detector 516 can instead be located within the block family manager 113 or within the processor 117 of the controller 115. The block family manager 113 can include a bin updater 514 among other components or modules to perform functionality of the block family (BF) manager 113, which will be discussed with reference to managing block families throughout this disclosure.

The local memory 119 can store a number of different items of information or data that will be discussed in more detail, including but not limited to, a block family (BF) start time 522, identified block families (BFs) 528, identified threshold voltage offset bins, e.g., multiple bins 530, one or more data state metric 540, a temporal voltage shift function 545, and a set of metadata tables 550. Recall that each of the multiple bins 530 includes a corresponding window of time after program (TAP) of data to the memory device 130.

More specifically, in various embodiments, the block family manager 113 can open a new block family after a previously block family has been closed. At initiation of the block family, the block family manger 113 can initialize the timer 512 associated with a system clock. The system clock, for example, can be a clock maintained by the memory sub-system 110 and/or the host system 120. The time at which the block family is opened on the system clock can be stored as the BF start time 522. The TAP discussed above can be based off of the BF start time for each respective block family and can also be tracked at the LUN, or logical block, level within the BF as well.

In some embodiments, slow charge loss can occur even while the memory sub-system 110 is powered off. If the memory sub-system 110 (or corresponding memory device 130) is powered off for a very long time, e.g., at least as long as a first threshold criterion (or value), then threshold voltage shift (TVS) of block families will have drifted such that previous bin pointers for block families can be outdated and need to be resynchronized to be associated with a new threshold voltage offset of a different threshold voltage offset bin. The bin updater 514 can perform characteristic measurements of data read out of the memory device 130, algorithmic processing, and this resynchronization as will be explained in more detail.

In various embodiments, the block family manger 113 can employ the power loss detector 516 to detect or receive an indication of imminent power loss of the memory sub-system 110. In one embodiment, the power loss detector 516 includes analog and/or digital circuits that monitor a voltage from the power source 501. When the voltage has dropped below a threshold voltage indicative of an imminent power loss, the block family manager 113 receives a signal of such imminent power loss. The threshold voltage is a sufficiently low voltage that if the power source 501 provides a voltage below the threshold voltage, it is known that the memory sub-system is losing power. Similar detection can also be performed by monitoring a current from the power source 501 and thus the detection of passing below the threshold voltage can be seen as equivalent to detection of passing below a threshold current supplied by the power source 501. For example, the power supply voltage is simply the power supply current multiplied times a resistance value for a sense resistor placed in line on a power supply bus of the power source 501.

In some embodiments, a power loss episode is a duration during which the memory sub-system 110 loses at least some indication of the passage of time. In one embodiment, a total lost clock power loss episode is a duration during which the memory sub-system 110 loses electronic clock indications of time and is powered back on without any indication of the passage of time while it was powered down. Further, a partial lost clock power loss episode is a duration during which the memory sub-system 110 loses the most accurate indication of the passage of time, e.g., the digital controller clock, but maintains some useful, but less accurate indication of the passage of time. This less accurate indication of the passage of time can come from the low power clock 504 that relies on a resistance-inductor-capacitor (RLC) circuit of the low power source 506 for power. For example, the low-power clock 504 can be powered by the low power source 506, such as a complementary metal-oxide-semiconductor (CMOS) battery, or the like, which retains charge without external power. In one embodiment, the low power clock 504 is within about plus or minus 30% accuracy of the digital controller clock of the memory sub-system 110, although accuracy range can vary depending on age of the low power source 506 and overall load on the low power source 506 while the memory sub-system is powered off.

In alternative embodiments, a synchronous power loss episode is a power loss episode where the host system 120 provides an indication that power loss will occur and allows significant time (potentially in the order of seconds) for the memory sub-system 110 to perform shutdown operations. This allows current write operations to finish and thus avoid the loss of data that is currently being programmed to the memory device 130. This embodiment can be executed where the memory device 130 enables a write flag that indicates to the memory system 120 that a write is still in progress and, if possible, to delay the system shutdown until it can be completed.

Further, an asynchronous capacitor-less power loss episode (either partial or total) is an event before which the memory sub-system 110 is given little or no indication there is to be such an event and there is no significant capacitive storage for operation after power loss. This scenario risks loss of data that is in the process of being written to the memory device 130. Thus, in systems that provide the capacitors 502 as a temporary backup source of power, an asynchronous capacitor-supplied power loss episode is one in which the capacitors 502 provide a limited time where memory operations may be performed after loss of power from the power source 501. In cases where additional time is provided by the host system 120 to power off, the capacitors 502 can extend a period of time from detecting the imminent power loss to an actual loss of power by the memory device 130.

In various embodiments, knowing the memory device 130 is about to lose power, the controller 115 can write fixed data 520 to the memory device 130 that will be used later to estimate, at least in part, the amount of time that the memory sub-system is powered off. This fixed data 520 can be written to a reserved location in the memory device 130, else the block family manager 113 can, in conjunction with the writing of the data, store a location of the data for reference after powering back on. The fixed data 520 can have a predetermined pattern that the controller 115 can recognize despite numerous bit errors occurring during a read attempt.

Thus, in response to powering back on, the block family manager 113 (e.g., bin updater 514) can measure a characteristic of the fixed data 520. For example, the block family manager 113 can measure one of temporal voltage shift (TVS) of the data or a read bit error rate (RBER) of the data.

The block family manager 113 can further determine an estimated amount of time for which the memory device was powered off based on results of the measuring. For example, if the TVS or RBER can provide a means for determining the amount of powered off time, e.g., 10% change in one of these values can equate to a certain amount of time such as one or several hours. In one embodiment, using the TVS and RBER calculations along with an estimate of temperature, an estimate of the elapsed time can be computed. This computation can be inferred from pre-characterized time and temperature TVS profiles, for example.

In one embodiment, in response to the estimated amount of time satisfying a first threshold criterion (e.g., being equal to or greater than a threshold time window), the bin updater 514 updates a value for a temporal voltage shift of a block family of programmed data based on the estimated amount of time. If, however, the estimated amount of time does not satisfy the first threshold criterion, the bin updater 514 knows the power off time has been sufficiently brief and can directly transition to execution of host memory command received from the host system 120. Either result (whether adjusting the temporal voltage shift of block families or moving directly to full operation of the memory device) can significantly reduce time to read (TTR) and time to performance (TTP). The TTR is a difference in time between when the memory sub-system 110 is first provided power during a power up and when the memory sub-system 110 delivers the data back from the first read command. The TTP is the time between when the memory sub-system 110 is first provided power and when it is able to satisfy all of the performance requirements, e.g., all host traffic requests at full bandwidth. Performing a resynchronization of block families to selection of threshold voltage offset bin (of the multiple bins 530) can be performed to determine where the TTP is at in relation to being ready for full memory device operation.

In various embodiments, the amount of time the memory sub-system 110 is powered off is estimated based on the system clock, as informed by measurements of characteristics of the fixed data 520, as was just discussed, and/or on a value of the low power clock 504, which is powered by the low power source 506. Thus, for example, the value of the low power clock 504 can be adjusted for expected accuracy loss, and then factored into the calculation of the amount of time the memory device 130 is powered off. The consideration of an adjusted value of the low power clock 504 can be based on a formula that compares the estimated amount of time from the characteristic measurement of the fixed data with the adjusted value, and updates the estimated amount of time based on the comparison. In some embodiments, the low power clock 504 is either not present or not sufficiently trusted, so use of the lower power clock to update the amount of time is optional.

In another embodiment, the block family manager 113 likewise stores a timer value (of the timer 512) in the memory device 130 (or other NVM device) upon detecting the imminent power loss. The block family manager 113 can further, upon powering back on, measure a data state metric 540 associated with one or more memory cell of a page or block of the memory device. The page or block can be from the fixed data 520 or from a block family, e.g., a youngest BF of the block families. The measurement can be the same or similar to a measurement made in order to estimate locations of bins with respect to block families after power on.

In various embodiments, the data state metric 540 is any data state value associated with pages of the block family that would be capable of extrapolation to determine time. For example, the data state metric can be a lower tail, an upper tail, or a median of a level seven (L7) distribution (for TLCs), the valley of the level six (L6) or level seven (L7) distributions (for TLCs), or a shift in read voltage necessary to reproduce the same fail bit count experienced before power loss. The block family manager 113 can also compare a level of the data state metric to the temporal voltage shift (TVS) function 545 to estimate a time after program value of the block. The TVS function is a function that describes how the data state metric varies as a function of time after program (TAP). The block manager manger 113 can then increment the timer value, restored from the memory device 130 (or other NVM device) based on the TAP value.

In yet another embodiment, the block family manager 113 stores not only the timer value (of the timer 512) but also a fail bit count to the memory device 130 (or other NVM device) in response to detecting the imminent power loss. The fail bit count can be a number of read failures counted per bit within the block family at a specific read voltage before the memory sub-system 110 is powered off. In response to detecting a power on of the system, the block family manger 113 can further estimate a temporal voltage shift (TVS) value, within memory cells of the pages or blocks, that results in approximately the same fail bit count within the block family. The block family manger 113 can estimate a time period the memory device 130 has been powered off based on the estimated TVS value, and increment the value of the timer 512, restored from the memory device 130 (or other NVM device) by the time period. The timer value that is restored to the timer 612 can then be more accurate in having incorporated the estimated amount of time the memory device 130 was powered off. A more accurate timer can be used in accurately tracking TAP for the block families 528, TTP time period, as well as TAP for any open block family which dictates, at least in part, when the open block family is closed.

In various embodiments, in response to the bin updater 514 updating a value for a temporal voltage shift of the block family based on the amount of time the memory device was powered off, the bin updater 514 can further resynchronize assignment of a threshold voltage offset bin (of the multiple bins 530) to the block family based on the updated value for the temporal voltage shift of the block family. Once the bin updaters 514 resynchronizes threshold voltage offset bins assigned to all block families impacted by the power off period of the memory device 130, the block family manager 113 can then signal to the controller 115 to transition to execution of host memory commands received from the host system 120. A more detailed explanation of this resynchronization is described with reference to FIG. 7.

Figure 6A:
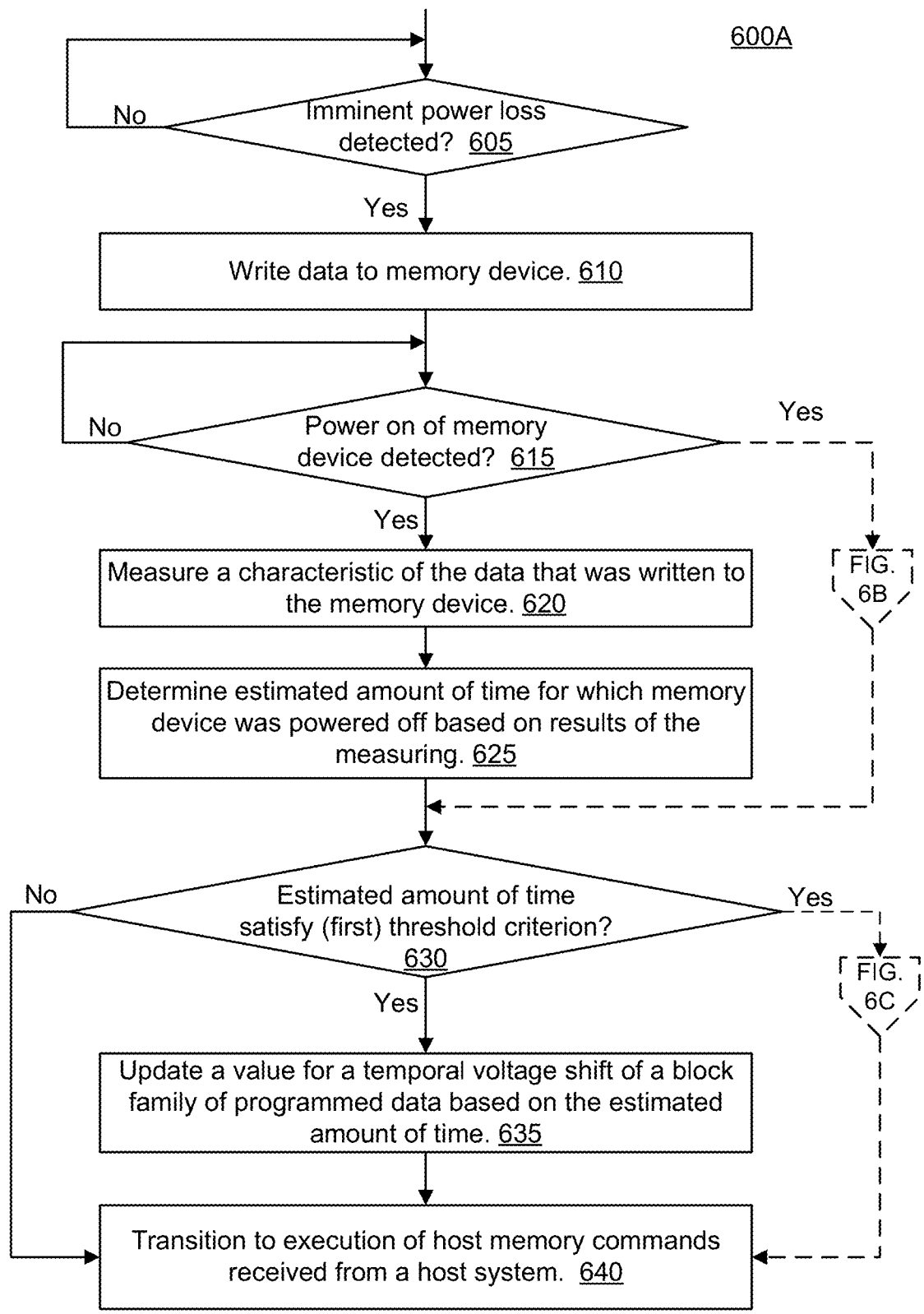
FIG. 6A is a flow diagram of an example method for updating temporal voltage shift of a block family based on powered off time, in accordance with some embodiments.

FIG. 6A is a flow diagram of an example method 600A for updating temporal voltage shift of a block family based on powered off time, in accordance with some embodiments. The method 600A can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600A is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 605, the processing logic determines whether an imminent power loss is detected. In one embodiment, the power loss detector 516 includes analog and/or digital circuits that monitor a voltage from the power source 501. When the voltage has dropped below a threshold voltage indicative of an imminent power loss, the block family manager 113 receives a signal of such imminent power loss. The threshold voltage is a sufficiently low voltage that if the power source 501 provides a voltage below the threshold voltage, it is known that the memory sub-system is losing power. Similar detection can also be performed by monitoring a current from the power source 501 and thus the detection of passing below the threshold voltage can be seen as equivalent to detection of passing below a threshold current supplied by the power source 501.

At operation 610, in response to detection of the imminent power loss, the processing logic writes data to the memory device. This data can be the fixed data 520 discussed with reference to FIG. 5.

At operation 615, the processing logic determines whether power on of the memory device 130 is detected. This detection usually also corresponds (if not slightly lags) detecting powering on of the memory subs-system 110 as a whole. In one embodiment, the power loss detector 516 can also detect powering on the memory device, e.g., by detecting a voltage from the power source 501 that exceeds the threshold voltage (or another different threshold voltage).

At operation 620, in response to detecting power on of the memory device 130, the processing logic measures a characteristic of the data in response to detecting a power on of the memory device. The characteristic, for example, can temporal voltage shift (TVS), read bit error rate (RBER), or other similar state metric. In one embodiment, the measuring can be measurement of the fixed data 520 that was written to the memory device directly before losing power. In an alternative embodiment, e.g., where the controller 115 had no warning of loss of power, the measurement can be of one or more memory cell of data from a page or block of a block family previous stored in memory. By tracking temporal voltage shift levels of the block family (e.g., as enabled by the features of FIG. 7), the results of such measurement can be compared to the most recently stored temporal voltage level in order to estimate the passage of time.

At operation 625, the processing logic determines an estimated amount of time for which the memory device 130 was powered off based on the results of the measuring. This determination can be made via comparison of a data state metric (determined by the measuring) to a temporal voltage shift function to determine the estimated amount of time. Other parameters or measured values can be compared to other such functions that change over time after program (TAP) to determine the estimated amount of time in different ways. The determination of the estimated amount of time the memory device 130 was powered off is discussed in more detail with reference to FIG. 5.

At operation 630, the processing logic determines whether the estimated amount of time satisfies a first threshold criterion, e.g., a first threshold value. Satisfying the first threshold criterion can include being greater than or equal to the first threshold value. The first threshold criterion can be a relatively low time value, such as between 15 and 45 minutes, during which the TVS, RBER, or other state metric has likely not changed enough to merit taking additional time from TTR or TTP to update threshold voltage levels of the block families. This amount of time can be customized and potentially adjusted (e.g., lowered) as the memory sub-system 110 ages.

At operation 635, in response to the estimated amount of time satisfying the first threshold criterion, the processing logic updates a value for a temporal voltage shift of a block family of programmed data based on the estimated amount of time. This update to the temporal voltage shift can be calculated using a data state metric input into, or comparison with, the temporal voltage shift function 545 or by using another function or formula that tracks a measured characteristic over time.

At operation 640, the processing logic transitions to execution of host memory commands received from the host system 120. In one embodiment, the this transition occurs after performing updates to temporal voltage shifts of multiple block families (BFs) 528 currently mapped within the metadata tables 550, as discussed with reference to FIG. 7.

FIG. 6B is a flow diagram of an example extension method 600B of the method 600A of FIG. 6A when considering a time value of a low power clock after power on in accordance with various embodiments. The method 600B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600B is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

As an alternative embodiment, the operations of the method 600B can be performed in lieu of operations 620 and 625 of the method 600A of FIG. 6A. At operation 650, the processing logic reads a time value of a low power clock, e.g., the low power clock 504 (FIG. 5). At operation 655, the processing logic measures a temporal voltage shift of the data, e.g., the fixed data 520 or the data of the page within the block family as discussed with reference to at least two different embodiments in method 600A. At operation 660, the processing logic determines, based on the time value and the temporal voltage shift, an estimated amount of time the memory device 130 was powered off. The consideration of an adjusted value of the low power clock 504 can be based on a formula that compares the estimated amount of time from the characteristic measurement of the fixed data 520 with the adjusted value, and updates the estimated amount of time based on the comparison.

FIG. 6C is a flow diagram of an example method 600C for tuning a temporal voltage shift measurement algorithm to measure temporal voltage shift of aged block families after power on, in accordance with some embodiments. The method 600C can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600C is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

In various embodiments, the operations of FIG. 6C can be performed in parallel with operations 635 and 640 of the method 600A of FIG. 6A in order to detect a more extended period of time that the memory device 130 has been powered off, and thus be able to handle the significantly older block families of programmed data.

At operation 670, the processing logic determines that the estimated amount of time satisfies a second threshold criterion that is greater than the first threshold criterion. This second threshold criterion (or second threshold value) can be from at least several hours to multiple days or weeks of time.

At operation 675, the processing logic tunes an algorithm, which is used to measure temporal voltage shift of block families, in order to accurately measure aged programmed pages based on the estimated amount of time. This tuning can use, for example, an iterative method in which the algorithm is updated a first time according to the estimated amount of time. The measuring performed at operation 620 (FIG. 6A) can be performed again using the tuned algorithm, followed by a determination of whether a resultant RBER is sufficiently small. If not sufficiently small, the processing logic can further tune the algorithm followed by further measuring until the RBER is below a threshold minimum RBER.

Figure 7:
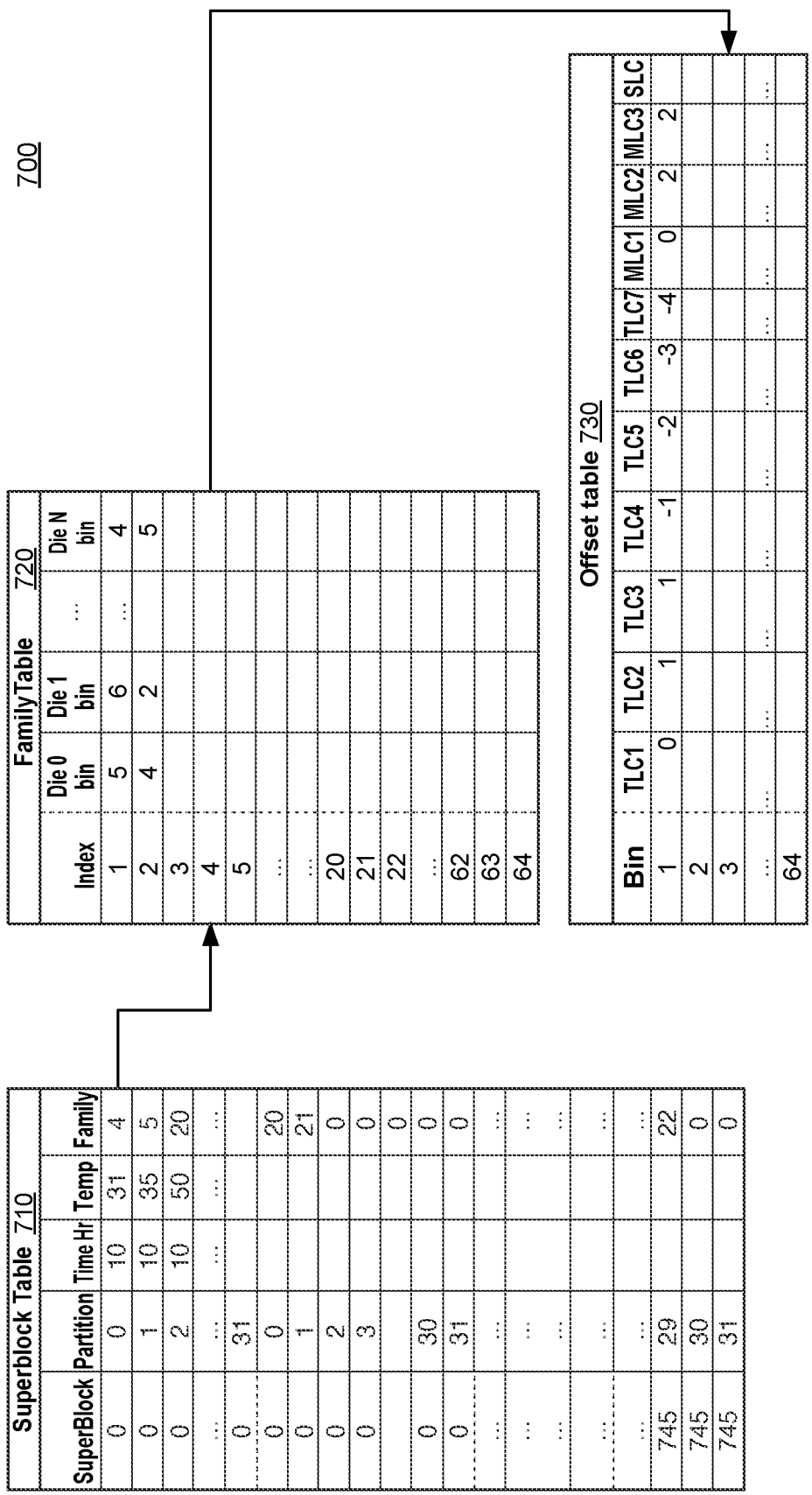
FIG. 7 is a graph that schematically illustrates metadata maintained by the memory sub-system controller operating in according with some embodiments.

FIG. 7 is a graph 700 that schematically illustrates metadata maintained by the memory sub-system controller operating in according with some embodiments. The metadata can be maintained for associating LUNs (e.g., blocks) or partial LUNs (e.g., codewords or pages) with block families. As schematically illustrated by FIG. 7, the memory sub-system controller can maintain a superblock table 710, a block family table 720, and an offset table 730 of the metadata tables 550. A superblock is a set of data blocks that span multiple dice that are written in an interleaved fashion. In some cases, a superblock can span all the dice within the memory device 130. A superblock can contain multiple data blocks from a single die, such as one per plane.

Each record of the superblock table 710 specifies the block family associated with the specified superblock and partition combination. In some implementations, records of the superblock table 710 can further include time and temperature values associated with the specified superblock and partition combination.

The block family table 720 is indexed by the block family number, such that each record of the block family table 720 specifies, for the block family referenced by the index of the record, a set of threshold voltage offset bins (e.g., bin pointers) associated with respective dies of the block family. In other words, each record of the block family table 720 includes a vector, each element of which specifies the threshold voltage offset bin associated with the die referenced by the index of the vector element. In one embodiment, all the dice of a plurality of dice in the memory device 130 point to a single bin. The threshold voltage offset bins to be associated with the block family dies can be determined by the calibration process, as described in more detail herein.

Further, the offset table 730 is indexed by the bin number. Each record of the offset table 730 specifies a set of threshold voltage offsets (e.g., for TLC, MLC, and/or SLC) associated with threshold voltage offset bin, and are die specific via the bin pointer indexing of the block family table 720.

In operation, upon receiving a read command, the memory sub-system controller 110 determines the physical address corresponding to the logical block address (LBA) specified by the read command. Components of the physical address, such as the physical block number and the die identifier, are utilized for performing the metadata table walk. For example, the superblock table 710 is first used to identify the block family identifier corresponding to the physical block number. Next, the block family identifier is used as the index to the block family table 720 in order to determine the threshold voltage offset bin associated with the block family and the die. Finally, the identified threshold voltage offset bin is used as the index to the offset table 730 in order to determine the threshold voltage offset corresponding to the identified threshold voltage offset bin. The memory sub-system controller can then additively apply the identified threshold voltage offset to the base voltage read level in order to perform the requested read operation.

In the illustrative example of FIG. 7, the superblock table 710 maps partition 0 of the superblock 0 to block family 4, which is utilized as the index to the block family table 720 in order to determine that die 0 is mapped to bin 3. The latter value is used as the index to the offset table in order to determine the threshold voltage offset values for bin 3. Not all values likely contained in the metadata tables 710-730 are illustrated for simplified illustration.

In various embodiments, when the bin updater 514 updates a temporal voltage shift value of a block family (e.g., operation 635 of FIG. 6A), the bin updater 514 updates the bin pointers of the vector to which the block family is indexed within the block family table 720. These bin pointers (which can vary across die of the block family) in turn point to corresponding threshold voltage offset bin(s) of the offset table 730. The bin updater 514 can further update the superblock table 710 to a potentially new index value of the block family table 720 based on the updates to the bin pointers therein. In this way, the updated indexing of both the superblock table 710 and the block family table 720 enable resynchronization of the block family to the appropriate threshold voltage offset bins that will enable performing reads to the block family while minimizing RBER. By the block family manager 113 performing this resynchronization (e.g., by updating bin selection for the block family) quickly after power on of the memory sub-system 110, the controller 115 can quickly enter into good performance while simultaneously minimizing the time the memory sub-system requires to start performing host commands, e.g., TTP.

The metadata tables 710-730 can be stored on one or more memory devices 130 of FIG. 1. In some implementations, at least part of the metadata tables 710-730 can be cached in the local memory 119 of the memory sub-system controller 115 of FIG. 1, e.g., as part of the metadata tables 550 (FIG. 5).

Figure 8:
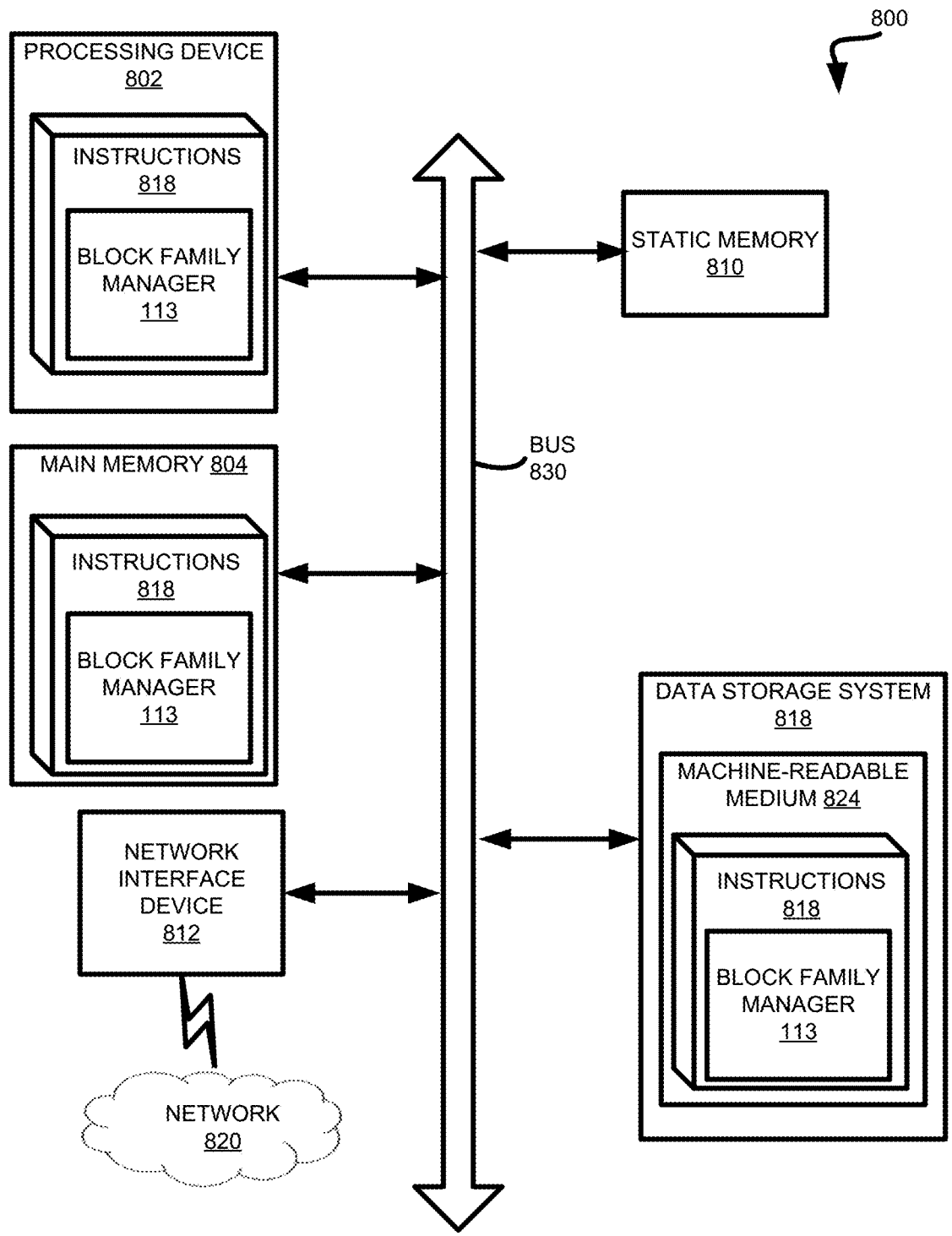
FIG. 8 is a block diagram of an example computer system in which embodiments of the present disclosure can operate.

FIG. 8 illustrates an example machine of a computer system 1200 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 810 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 828 for performing the operations and steps discussed herein. The computer system 800 can further include a network interface device 812 to communicate over the network 820.

The data storage system 818 can include a machine-readable storage medium 824 (also known as a computer-readable medium) on which is stored one or more sets of instructions 828 or software embodying any one or more of the methodologies or functions described herein. The instructions 828 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 828 include instructions to implement functionality corresponding to the block family manager 113 of FIG. 1. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
 a memory device; and
 a processing device, operatively coupled to the memory device, the processing device to perform operations comprising:
  measuring one of a temporal voltage shift or a read bit error rate of fixed data stored in the memory device in response to detecting a power on of the memory device, the fixed data having been programmed in response to detecting a power loss;
  estimating an amount of time for which the memory device was powered off based on results of the measuring; and
  in response to the amount of time satisfying a threshold criterion, updating a value for the temporal voltage shift of a block family based on the amount of time.

2. The system of claim 1, wherein the operations further comprise:
 detecting a voltage of a power source for the memory device has dropped below a threshold voltage indicative of an imminent power loss; and
 writing the fixed data to the memory device in response to the detecting.

3. The system of claim 2, wherein the fixed data is of a predetermined pattern, and the operations further comprise, in conjunction with the writing, storing a location of the fixed data.

4. The system of claim 1, wherein the operations further comprise:
 resynchronizing assignment of a threshold voltage offset bin to the block family based on the updated value for temporal voltage shift of the block family; and
 transitioning to execution of host memory commands received from a host system.

5. The system of claim 1, wherein the measuring comprises measuring a data state metric associated with one or more memory cell of the data, and the operations further comprise:
 comparing a level of the data state metric to a temporal voltage shift function to estimate the amount of time; and
 incrementing a value of a timer, restored from the memory device, based on the amount of time.

6. The system of claim 1, wherein the operations further comprise:
 determining that the amount of time does not satisfy the threshold criterion; and
 transitioning directly to execution of host memory commands received from a host system.

7. The system of claim 1, wherein the operations further comprise:
 determining that the amount of time satisfies a second threshold criterion that is greater than the threshold criterion;
 tuning an algorithm, which is used to measure temporal voltage shift of block families, in order to accurately measure aged programmed pages based on the amount of time; and
 transitioning to execution of host memory commands received from a host system.

8. The system of claim 1, further comprising:
 a power source to power the memory device; and
 one or more capacitors coupled to the power source to extend a period of time from detecting the power loss to a loss of power of the memory device.

9. A method comprising:
 measuring, by a processing device of a memory sub-system, one of a temporal voltage shift or a read bit error rate of fixed data stored in a memory device in response to detecting a power on of the memory device, the fixed data having been programmed in response to detecting a power loss;
 estimating, by the processing device, an amount of time for which the memory device was powered off based on results of the measuring; and
 in response to the amount of time satisfying a threshold criterion, updating, by the processing device, a value for a temporal voltage shift of a block family based on the amount of time.

10. The method of claim 9, wherein the fixed data is of a predetermined pattern, and the method further comprises:
 detecting a voltage of a power source for the memory device has dropped below a threshold voltage indicative of an imminent power loss;
 writing the fixed data to the memory device in response to the detecting; and
 storing a location of the fixed data for later use.

11. The method of claim 9, further comprising:
 resynchronizing assignment of a threshold voltage offset bin to the block family based on the updated value for temporal voltage shift of the block family; and
 transitioning to execution of host memory commands received from a host system.

12. The method of claim 9, wherein the measuring comprises measuring a data state metric associated with one or more memory cell of the data, the method further comprising:
 comparing a level of the data state metric to a temporal voltage shift function to estimate the amount of time; and
 incrementing a value of a timer, restored from the memory device, based on the amount of time.

13. The method of claim 9, further comprising:
 determining that the amount of time does not satisfy the threshold criterion; and
 transitioning directly to execution of host memory commands received from a host system.

14. The method of claim 9, further comprising:
 determining that the amount of time satisfies a second threshold criterion that is greater than the threshold criterion;
 tuning an algorithm, which is used to measure the temporal voltage shift of block families, in order to accurately measure aged programmed pages; and
 transitioning to execution of host memory commands received from a host system.

15. A method comprising:
 in response to detecting a power on of a memory device of a memory sub-system:
  reading a time value of a low power clock;

measuring a temporal voltage shift of fixed data having been programmed in the memory device in response to detecting a power loss; and estimating, based on the time value and the temporal voltage shift, an amount of time the memory device was powered off; and updating, in response to the amount of time satisfying a threshold criterion, a value for temporal voltage shift of a block family based on the amount of time.

16. The method of claim 15, wherein updating the value for the temporal voltage shift of the block family further comprises updating bin pointers of a vector in a block family table indexed to the block family from a superblock table.

17. The method of claim 15, further comprising:

resynchronizing assignment of a threshold voltage offset bin to the block family based on the updated value of the temporal voltage shift for the block family; and transitioning to execution of host memory commands received from a host system.

18. The method of claim 15, wherein the measuring comprises measuring a data state metric associated with one or more memory cell of the data, the method further comprising:

comparing a level of the data state metric to a temporal voltage shift function to estimate the amount of time; and incrementing a value of a timer, restored from the memory device, based on the amount of time.

19. The method of claim 15, further comprising:

determining that the amount of time does not satisfy the threshold criterion; and transitioning directly to execution of host memory commands received from a host system.

20. The method of claim 15, further comprising:

determining that the amount of time satisfies a second threshold criterion that is greater than the threshold criterion;

tuning an algorithm, which is used to measure temporal voltage shift of block families, in order to accurately measure aged programmed pages; and transitioning to execution of host memory commands received from a host system.

* * * * *